(12) United States Patent
Tung

(10) Patent No.: US 6,238,959 B1
(45) Date of Patent: May 29, 2001

(54) METHOD OF FABRICATING LDMOS TRANSISTOR

(75) Inventor: Ming-Tsung Tung, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/366,376

(22) Filed: Aug. 3, 1999

(51) Int. Cl.$^7$ .................................................. H01L 21/336

(52) U.S. Cl. .......................... 438/197; 438/223; 438/221

(58) Field of Search ..................................... 438/316, 133, 438/135, 223, 224, 197, 218, 221

(56) References Cited

U.S. PATENT DOCUMENTS

| 5,252,848 | * | 10/1993 | Adler | 257/493 |
| 5,825,065 | * | 10/1998 | Corsi et al. | 257/328 |
| 6,144,069 | * | 11/2000 | Tung | 257/335 |

* cited by examiner

*Primary Examiner*—Tuan H. Nguyen

(57) ABSTRACT

The present invention is about a single side high voltage lateral diffused metal-oxide-semiconductor (LDMOS) transistor. The drain side is low-voltage N-well with lower concentration to increase driving voltage while the source side is low-voltage P-well with higher concentration to increase the interior electric field such that the conductivity is improved and the threshold voltage is adjusted by high-voltage P-well with lower concentration.

11 Claims, 6 Drawing Sheets

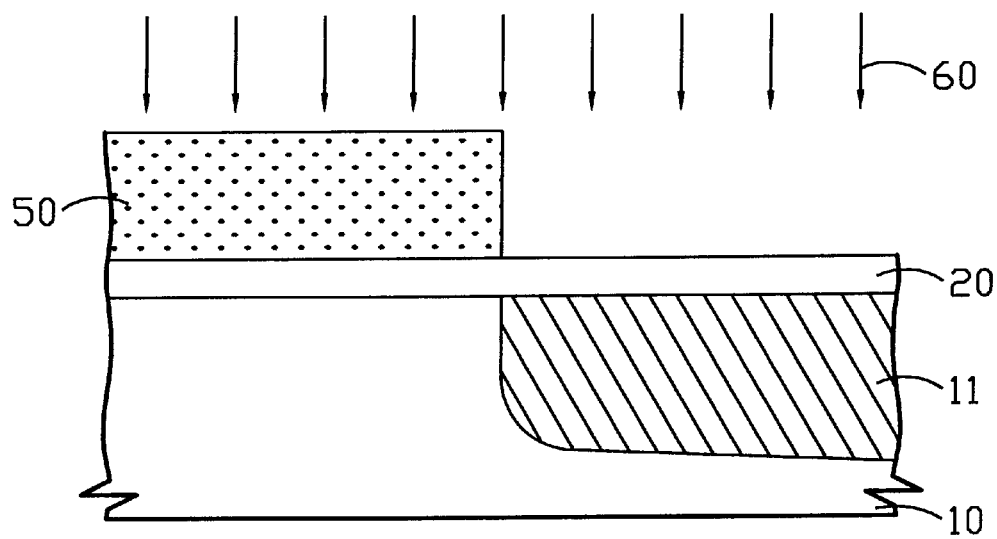
FIG.2A
FIG.2B
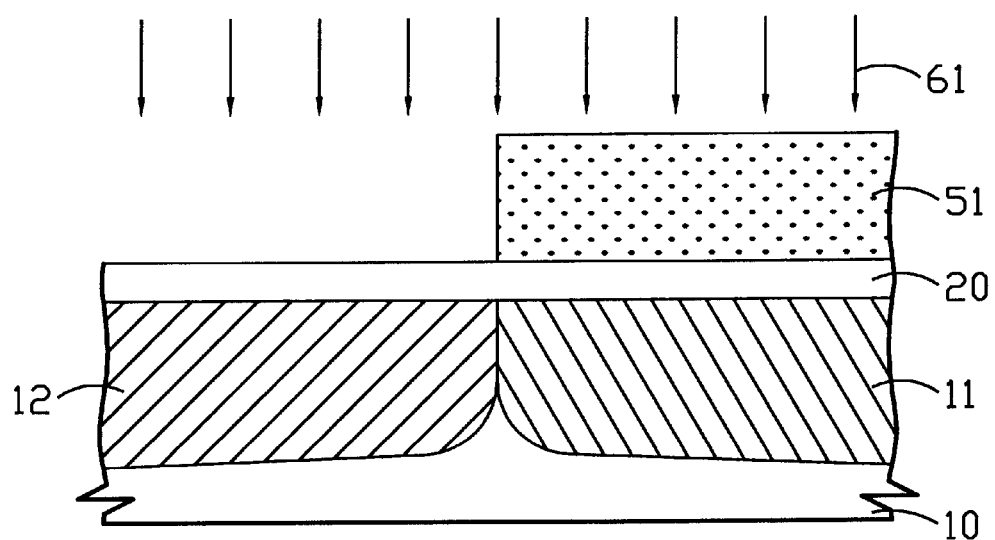
FIG.2C

METHOD OF FABRICATING LDMOS TRANSISTOR

BACKGROUND OF THE INVENTION

1. Field of the Invention

The present invention generally relates to a method for forming a semiconductor device, and more particularly to a method for forming a lateral diffused metal-oxide-semiconductor (LDMOS) transistor.

2. Description of the Prior Art

Power semiconductor devices are currently being used in many applications. Such power devices include high-voltage integrated circuits which typically include one or more high-voltage transistors, often on the same chip as low-voltage circuitry. A commonly used high-voltage component for these circuits is the lateral double diffused MOS transistor (LDMOS). LDMOS structures used in the high-voltage integrated circuits may generally be fabricated using some of the same techniques used to fabricate the low voltage circuitry or logic circuitry. In general, these existing LDMOS structures are fabricated in a thick epitaxial layer of opposite conductivity type to the substrate.

High-power applications have called for the use of such lateral double diffused MOS transistors primarily because they possess lower "on" resistance, faster switching speed, and lower gate drive power dissipation than their bi-polar counterparts. These devices have heretofore also been strongly associated with bi-polar based process flows when integrated into a Bi-CMOS environment.

On the development of ultra-large-scale-integrated (ULSI), the layout rule will shrink and the application of product is going to develop on a multi-chip of integrated function. The prior LDMOS transistor is implemented by LOCOS process. Referring to FIG. 1, an N-type well 112 and a P-type well 110 with lighter concentration are formed in a P-type substrate 100, and a field oxide (fox) region 120 is formed between gate 140 and source/drain 114A. However, such process could not meet the requirement of the layout rule in ULSI.

SUMMARY OF THE INVENTION

In accordance with the present invention, a method is provided for forming LDMOS transistor that substantially can decrease the width of the LDMOS transistor.

It is another object of this invention to provide an integrated trench oxide process in the formation of an LDMOS transistor.

In one embodiment, a method for forming the LDMOS transistor is disclosed. The method includes providing a substrate having a first conductivity type and then forming a first high-voltage region with second conductivity type opposite to the first conductivity type. Then, a second high-voltage region with the first conductivity type is formed adjacent to and in contact with the first high-voltage region, and at least one trench isolation region is formed in the first high-voltage region. Next, a first low-voltage region is formed in the first high-voltage region, such that the trench isolation region is included in the first low-voltage region. A second low-voltage region is formed in the second high-voltage region. A gate structure is formed adjacent to and partially overlapping between the trench isolation region and the second low-voltage region. A first source/drain region is formed in the first low-voltage region and a second source/drain region is formed in the second low-voltage region adjacent opposite sides of the gate structure in the top surface of the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
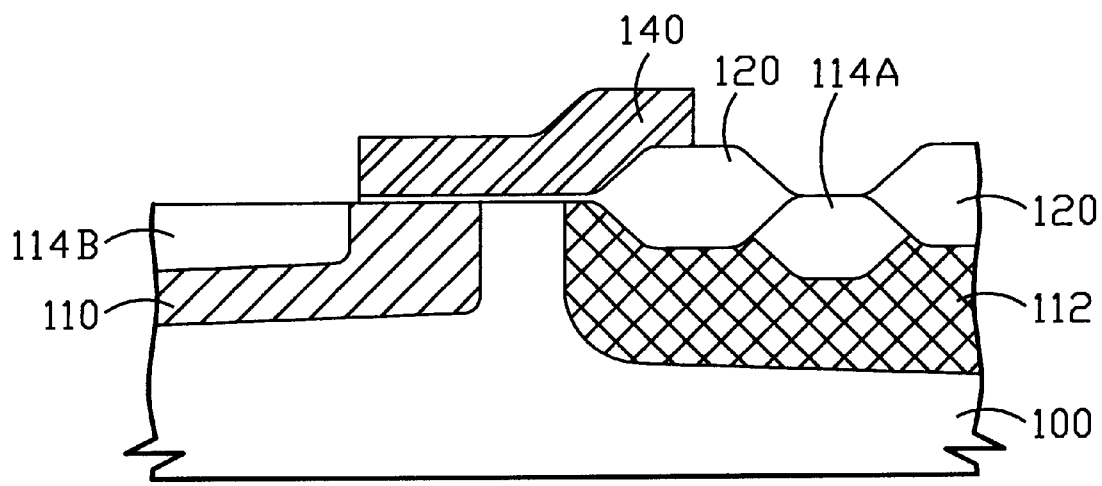
FIG. 1 is a cross-sectional view of a prior LDMOS transistor.

The semiconductor devices of the present invention are applicable to a broad range of semiconductor devices and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also be advantageously employed in gallium arsenide, germanium, and other semiconductor materials. Accordingly, application of the present invention is not intended to be limited to those devices fabricated in silicon semiconductor materials, but will include those devices fabricated in one or more of the available semiconductor materials.

Moreover, while the present invention is illustrated by a number of preferred embodiments directed to silicon semiconductor devices, it is not intended that these illustrations be a limitation on the scope or applicability of the present invention. Further, while the illustrative examples use insulated gate control structures, it should be recognized that the insulated gate portions may be replaced with light activated or current activated structure(s). Thus, it is not intended that the semiconductor devices of the present invention be limited to the structures illustrated. These devices are included to demonstrate the utility and application of the present invention to the presently preferred embodiments.

Further, various parts of the semiconductor elements have not been drawn to scale. Certain dimensions have been exaggerated in relation to other dimensions in order to provide a clearer illustration and understanding of the present invention. For the purposes of illustration, the preferred embodiment of the semiconductor devices of the present invention have been shown to include specific P- and N-type regions, but it should be clearly understood that the teachings herein are equally applicable to semiconductor devices in which the conductivities of the various regions have been reversed, for example, to provide the dual features of the illustrated device. Enhancement and depletion mode structures may be similarly interchanged.

Further, although the embodiments illustrated herein are shown in two dimensional views with various regions having width and depth, it should be clearly understood that these regions are illustrations of only a portion of a single cell of a device, which may include a plurality of such cells arranged in a three-dimensional structure. Accordingly, these regions will have three dimensions, including length, width and depth, when fabricated in an actual device.

Referring to FIG. 2A, a P-type substrate 10 is provided and a silicon oxide layer 20 is formed thereon. In this embodiment, since the provided P-type substrate 10 is for N-type MOS transistor, all P-type and N-type will interchange while an N-type MOS transistor is provided. The oxide layer 20 with thickness between about 100 to 300 angstroms is formed by any conventional method such as heated in furnace. This oxide layer 20 is sacrificial oxide layer whose intent will prevent channel effect on the following ion implantation.

Figure 2D:
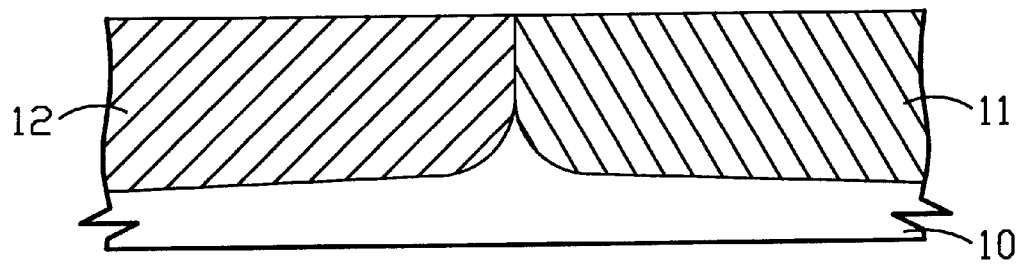
FIGS. 2A to 2O are schematic representations of structures at various stages during the formulation of the LDMOS transistor in accordance with a method disclosed.

Referring to FIG. 2B, a photoresist layer 50 is formed on the oxide layer 20 using any suitable method and transfers a high-voltage voltage N-well pattern in this photoresist layer 50. Then, an ion implantation 60 is introduced into substrate 10 to form a high-voltage N-well 11 and the photoresist layer 50 is then stripped. The term high-voltage denotes the voltages to which the devices formed in these wells will be subjected. High voltages, such as twelve and eighteen volts, or transients up to about sixty volts, usually require larger and deeper tanks but with smaller (or lighter) dopant concentrations. Similarly, another photoresist layer 51 is formed on this oxide layer 20 by using any suitable method and transfers a high-voltage P-well pattern in this photoresist layer 51, as shown in FIG. 2C. Then, an ion implantation 61 is introduced into substrate 10 to form a high-voltage P-well 12 and the photoresist layer 51 is then stripped. Having finished the two ion implantation steps, the wafer is placed into a furnace and the implanted ions will drive in substrate 10 by high temperature diffusion. Then, the oxide layer 20 is removed by any conventional method, as shown in FIG. 2D.

Figure 2E:
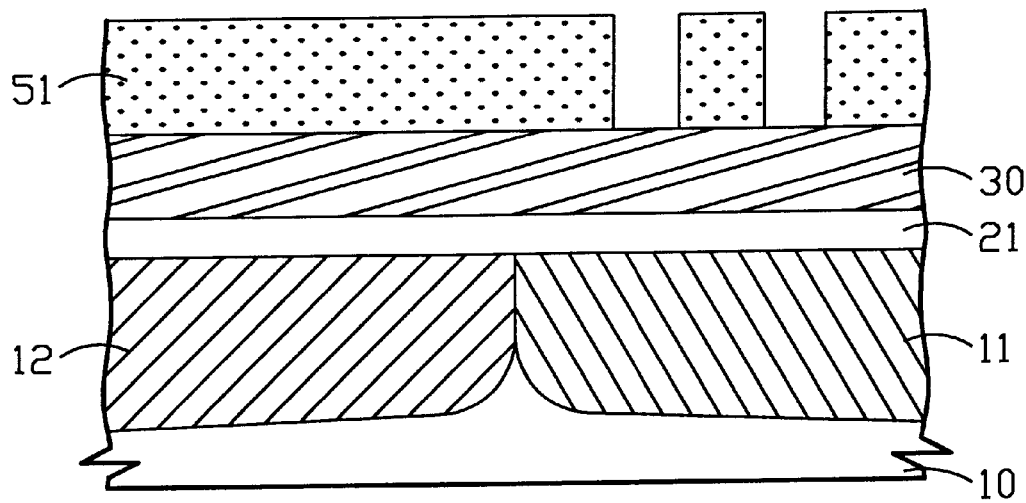

Referring to FIG. 2E, a pad oxide layer 21 is formed on the substrate 10 using a conventional thermal method and has a thickness between about 100 to 200 angstroms. (The purpose of the pad oxide layer 21 is to act as a buffer between substrate 10 and the following silicon nitride layer since shear stress is produced between the silicon crystal and the silicon nitride layer and defects will be generated.) Then, a silicon nitride layer 30 is deposited on the pad oxide layer 21 using any conventional method, such as the low pressure chemical vapor deposition (LPCVD) method or the plasma enhanced chemical vapor deposition (PECVD) method, and has a thickness of between about 1000 to 2000 angstroms. The prior application of silicon nitride layer is the mask of oxide layer in the local oxidation (LOCOS) process. In this invention, the silicon nitride layer 30 is the mask of substrate 10 in forming trench isolation.

A photoresist layer 52 is formed on the silicon nitride layer 30 and transfers a trench isolation pattern into the photoresist layer 52. There is only one trench isolation region in a semiconductor device usually, however, two trench isolation patterns are shown in FIG. 2E. The amounts of trench isolation regions depend on the layout rule and line width, i.e., at least one trench isolation region may be formed.

Figure 2F:
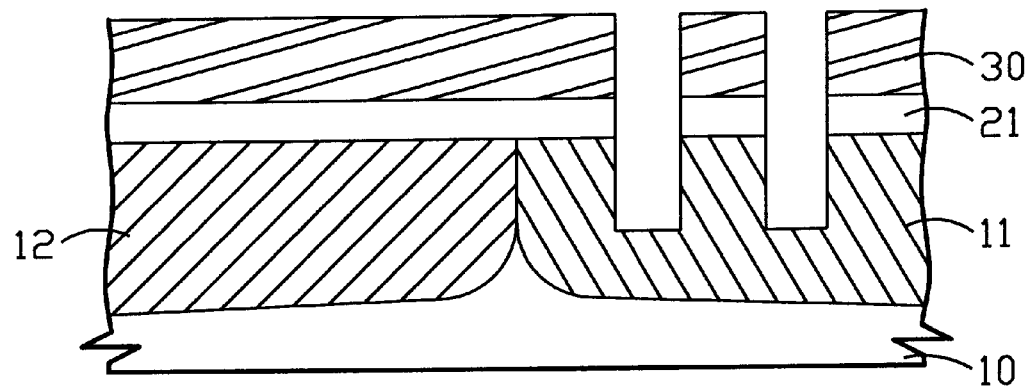

Referring to FIG. 2F, the silicon nitride layer 30, pad oxide layer 21 and substrate 10 are sequentially etched using photoresist layer 52 as a mask using suitable method. This etching step is essentially anisotropic dry etching, and the photoresist layer 52 is then stripped. Then, the trench isolation openings are filled by silicon oxide.

Figure 2G:
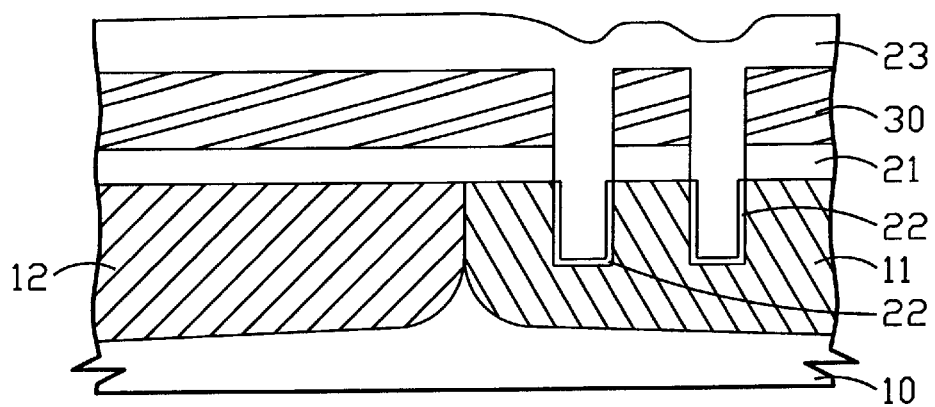

Referring to FIG. 2G, the wafer is placed into a furnace to grow a silicon oxide layer 22 with a thickness of between about 100 to 500 angstroms. Then, another oxide layer 23 is deposited using APCVD method with a thickness between about 5000 to 9000 angstroms. Because the density of this APCVD oxide layer 23 is less, the oxide layer 23 will be densified by placing the wafer into a furnace to a high temperature.

Figure 2H:
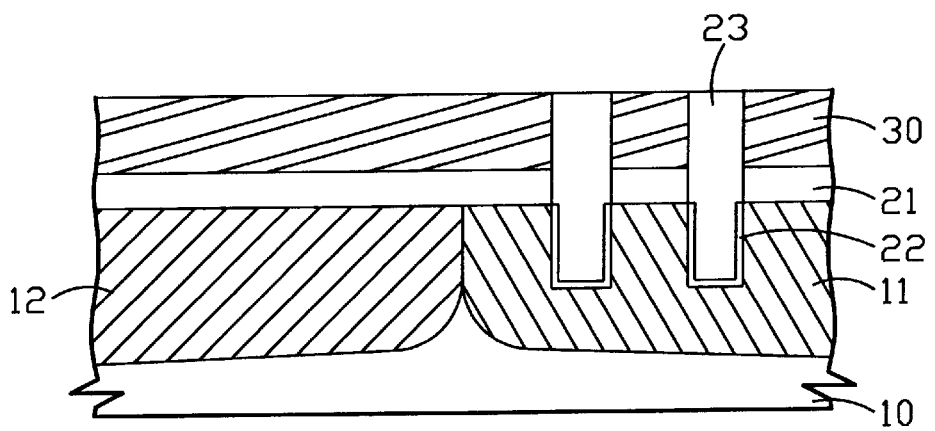
Figure 2I:
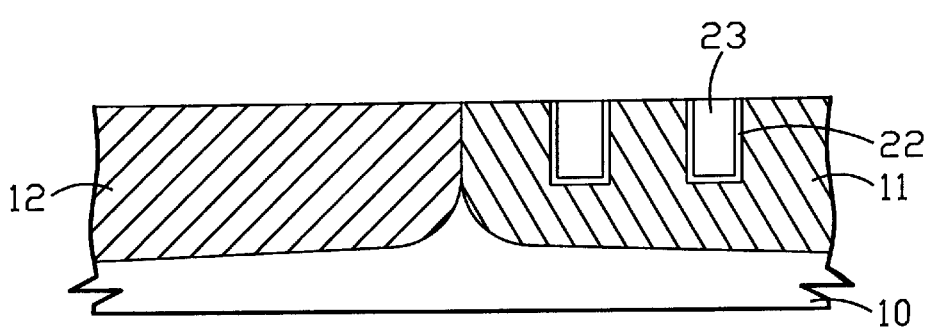

Referring to FIG. 2H, after depositing the oxide layer 23, this oxide layer 23 is planarized by using chemical mechanical polishing method. Then, the silicon nitride layer 30 and pad oxide layer 21 are removed by using any conventional method, as shown in FIG. 2I.

Figure 2J:
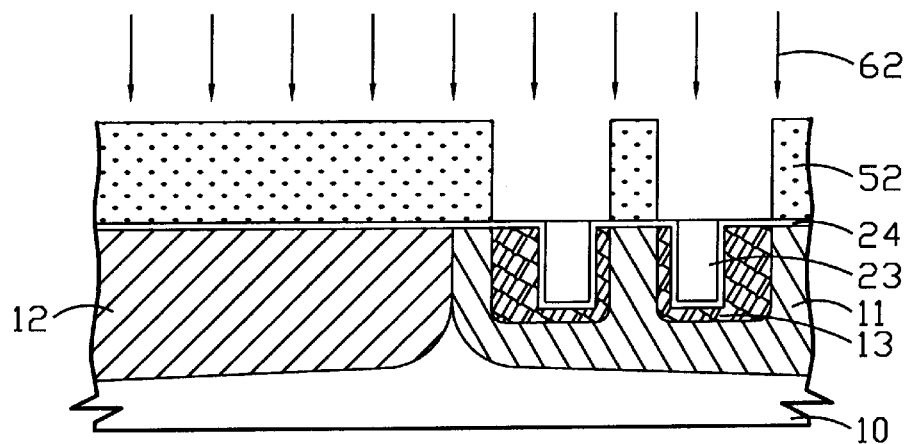
Figure 2K:
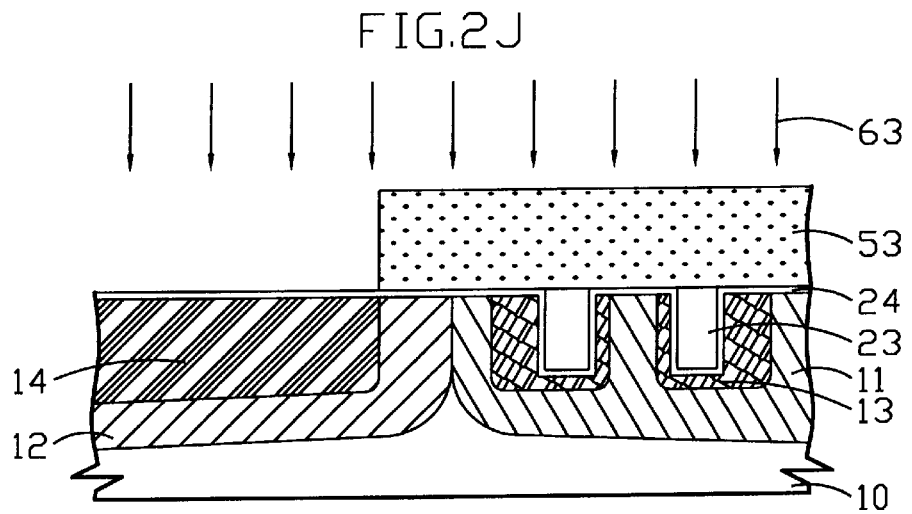

Before forming low-voltage N-well and P-well, another sacrificial oxide layer 24 is formed again on the substrate 10 and has a thickness between about 100 to 200 angstroms, as shown in FIG. 2J. Then, a photoresist layer 52 is formed on this oxide layer 24 by using any suitable method and transferred a low-voltage N-well pattern in this photoresist layer 52. Then, an ion implantation 62 is introduced into substrate 10 to form a low-voltage N-well 13 and the photoresist layer 52 is then stripped. Similarly, another photoresist layer 53 is formed on this oxide layer 24 by using any suitable method and transferred a low-voltage P-well pattern in this photoresist layer 53, as shown in FIG. 2K. Then, an ion implantation 63 is introduced into substrate 10 to form a low-voltage P-well 14 and the photoresist layer 53 is then stripped. Having finished the two ion implantation steps, the wafer is placed into furnace and annealing by high temperature diffusion. Then, the oxide layer 24 is removed by any conventional method.

Figure 2L:
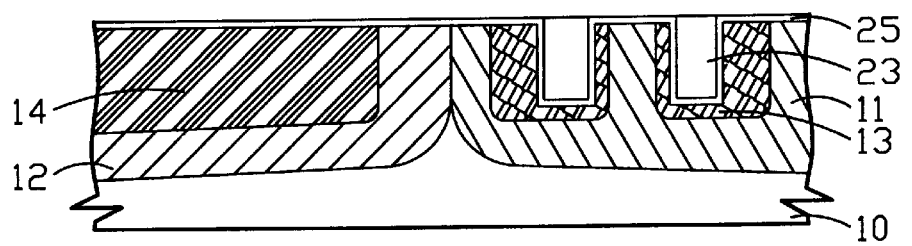
Figure 2M:
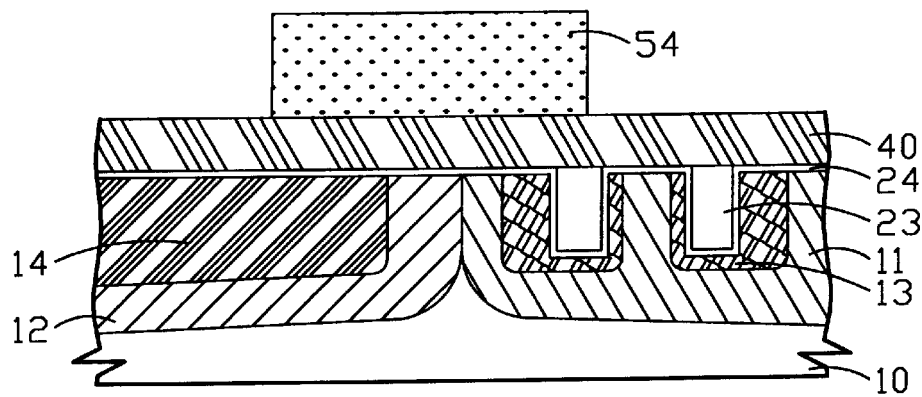

The following steps are for forming gate, source and drain in MOS transistor. Referring to FIG. 2L, a gate oxide layer 25 is formed on the substrate 10 using any conventional method. A polysilicon layer 40 is deposited and is doped on the oxide layer 25 using any conventional method, as shown in FIG. 2M. In the preferred embodiment, the gate electrode comprises doped polysilicon. Other conductive materials including metals or silicides can also be used. Then, a photoresist layer 54 is formed on the polysilicon layer 40 and transfers a gate pattern into this photoresist layer 54. The gate pattern will overlap a portion of trench isolation region and a portion of low-voltage P-well 13.

Figure 2N:
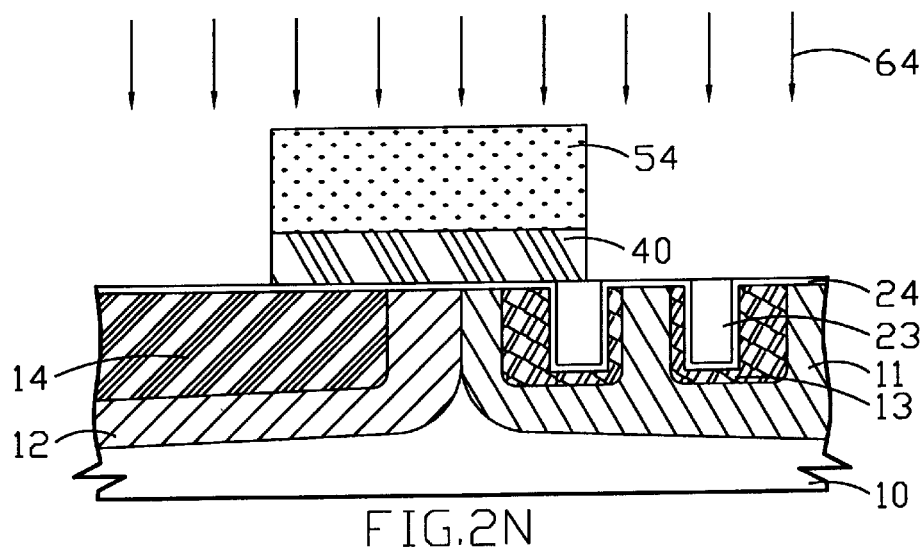
Figure 2O:
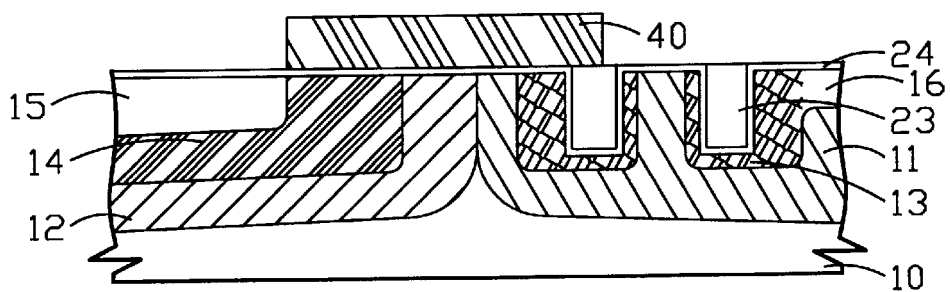

Then, the polysilicon layer 40 is etched to form a gate electrode by using conventional etching 64, as shown in FIG. 2N. Next, source and drain regions 15 and 16 are formed on the opposite ends of the gate structure.

Although specific embodiments have been illustrated and described, it will be obvious to those skilled in the art that various modifications may be made without departing from what is intended to be limited solely by the appended claims.

What is claimed is:

1. A method for forming an LDMOS transistor, said method comprising:

providing a substrate having a first conductivity type;

forming a first high-voltage region with a second conductivity type opposite to said first conductivity type;

forming a second high-voltage region with said first conductivity type adjacent to and in contact with said first high-voltage region;

forming at least one trench isolation region in said first high-voltage region;

forming a first low-voltage region within said first high-voltage region, such that said trench isolation region is included in said first low-voltage region;

forming a second low-voltage region within said second high-voltage region;

forming a gate structure adjacent to and partially overlapping between said trench isolation region and said second low-voltage region; and forming a first source/drain region in said first low-voltage region and a second source/drain region in said second low-voltage region adjacent opposite sides of said gate structure in said top surface of said substrate.

2. The method according to claim 1, wherein the concentration of said high-voltage region is lower than said low-voltage region.

3. The method according to claim 1, wherein said trench isolation region is formed by filling silicon oxide into trench.

4. The method according to claim 3, further comprising a step of thermally growing a silicon oxide layer.

5. The method according to claim 1, wherein said step of forming a gate structure comprises the steps of depositing a polysilicon layer, doping said polysilicon layer and patterning and etching said polysilicon layer.

6. The method according to claim 5, wherein said gate electrode is in situ doped during said step of depositing.

7. The method according to claim 1, wherein said substrate comprises a silicon layer.

8. A method for forming a single side high voltage LDMOS transistor, said method comprising:

providing a silicon layer having a first conductivity type;

forming a first high-voltage region with second conductivity type opposite to said first conductivity type;

forming a second high-voltage region with said first conductivity type adjacent to and in contact with said first high-voltage region;

forming at least one opening in said first high-voltage region;

depositing a silicon oxide layer into said opening;

forming a first low-voltage region within said first high-voltage region, such that said trench isolation region is included in said first low-voltage region;

forming a second low-voltage region within said second high-voltage region;

forming a gate structure adjacent to and partially overlapping between said trench isolation region and said second low-voltage region; and forming a first source/drain region in said first low-voltage region and a second source/drain region in said second low-voltage region adjacent opposite sides of said gate structure in said top surface of said substrate.

9. The method according to claim 8, wherein the concentration of said high-voltage region is lower than said low-voltage region.

10. The method according to claim 8, wherein said step of forming a gate structure comprises the steps of depositing a polysilicon layer, doping said polysilicon layer and patterning and etching said polysilicon layer.

11. The method according to claim 10, wherein said gate electrode is in situ doped during said step of depositing.

* * * * *